United States Patent [19]
Cappelletti et al.

[11] Patent Number: 5,612,913
[45] Date of Patent: Mar. 18, 1997

[54] BYTE ERASABLE EEPROM FULLY COMPATIBLE WITH A SINGLE POWER SUPPLY FLASH-EPROM PROCESS

[75] Inventors: Paolo Cappelletti, Seveso; Giulio Casagrande, Vignate, both of Italy

[73] Assignee: SGS-Thomson Microelectronics, S.r.l., Agrate Brianza, Italy

[21] Appl. No.: 533,631

[22] Filed: Sep. 25, 1995

[30] Foreign Application Priority Data

Sep. 27, 1994 [EP] European Pat. Off. .............. 94830459

[51] Int. Cl.$^6$ ..................................................... G11C 7/00
[52] U.S. Cl. .............................. 365/185.12; 365/185.18; 365/185.33
[58] Field of Search ....................... 327/536; 365/185.33, 365/185.12, 185.18

[56] References Cited

U.S. PATENT DOCUMENTS

| | | |
|---|---|---|
| 4,949,309 | 8/1990 | Rao . |
| 5,033,023 | 7/1991 | Hsia et al. ............................... 365/104 |
| 5,077,691 | 12/1991 | Haddad et al. . |
| 5,270,980 | 12/1993 | Pathak et al. ............................ 365/184 |
| 5,319,604 | 6/1994 | Imondi et al. ...................... 365/189.11 |
| 5,339,279 | 8/1994 | Toms et al. ......................... 365/185.33 |
| 5,430,674 | 7/1995 | Javanifard ............................... 365/218 |

FOREIGN PATENT DOCUMENTS

0405140   1/1991   European Pat. Off. .

Primary Examiner—David C. Nelms
Assistant Examiner—Michael T. Tran
Attorney, Agent, or Firm—Robert Groover; Betty Formby

[57] ABSTRACT

A byte erasable memory with an EEPROM type functionality that can be integrated in a fully compatible way with a standard FLASH process is composed by a matrix of FLASH cells organized in n bytes, each of m bits, addressable through a plurality of wordlines and bitlines. The EEPROM-type memory has an auxiliary selection structure composed of an n number of byte select transistors, a plurality of individually selectable source biasing lines and a plurality of select lines in the same number of the wordlines and selectable in a biunivocal way with the wordlines. The cells of a byte have a common source that is accessed and individually selectable through the respective select transistor. EEPROM functionality is obtained without any modification of the standard FLASH fabrication process by splitting the voltage applied between a control gate and the respective common source region of the cells that compose a certain selected byte about a common ground potential, during a byte erasing phase thus reducing the electrical stress induced on deselected cells.

27 Claims, 5 Drawing Sheets

FIG. 1

|  | PROGRAM | ERASE | READ |
|---|---|---|---|
| SELECTED WORD LINE | 20 V | 20 V | 5 V |
| UNSELECTED WORD LINE | 0 V | 0 V | 0 V |
| PROGRAM LINE | 17 V | 0 V | 0 V |
| BIT LINE 0 (ERASED) | 0 V | 17 V | 1.6 V |
| BIT LINE 7 (PROGRAMMED) | 0 V | 0 V | 2.0 V |

BYTE ERASABLE EEPROM FULLY COMPATIBLE WITH A SINGLE POWER SUPPLY FLASH-EPROM PROCESS

CROSS-REFERENCE TO RELATED APPLICATION

This application claims priority from EP 94830459.7, filed SEP. 27, 1994, which is hereby incorporated by reference. However, the content of the present application is not necessarily identical to that of the priority application.

BACKGROUND AND SUMMARY OF THE INVENTION

The present invention relates to memories which combine FLASH (sector-erasable) and EEPROM (byte-erasable) memory on a single chip.

Background: Floating-Gate Memories

The development of nonvolatile memories based on the principle of trapping an electrical charge in an isolated (floating) gate of a field effect transistor (cell) in order to modify its turn-on threshold, has had and continues to have an extremely important role in the achievement of ever increasing levels of compactness and of speed of integrated systems.

Programming and Erasure Mechanisms

The development of such memories is strictly tied to a parallel development of suitable fabrication technologies and to the physical mechanisms that can be practically exploited for injecting electrical charges in a floating gate through an isolating dielectric, which often constitutes also the gate dielectric of the (transistor) cell. The physical mechanisms that are normally exploited are the following:

- the so-called Fowler-Nordheim tunnelling mechanism that is operative with relatively thick oxide layers and requires a strong electric field;
- the direct tunneling mechanism that is operative with relatively thin oxide layers and with a relatively strong electric field;
- a "modified" Fowler-Nordheim tunnelling mechanism that is operative with a thin dielectric layer and with an electric field of medium intensity;
- the charge-trap assisted injection mechanism wherein charge trapping sites are rearranged at the interface between the conductor and the dielectric and which is effective with thin dielectrics and with a relatively low electric field intensity;
- the channel hot carriers injection mechanism that is operative throughout an ample range of dielectric thicknesses and of electric field intensities.

Of course, the tunnelling mechanisms may theoretically be exploited also for extracting (discharging) electric charges from the floating gate, that is for electrically "erasing" the cell, even though the voltages that are required must be compatible with the physical-electrical structure of the cell.

The choice of the charge and discharge mechanisms will affect not only the structure of the memory cell itself, but also the overhead (ancillary) circuitry, with a particular regard to writing, reading and eventually also erasing circuits of the memory. This may be illustrated by posing case-by-case precise requisites of voltage and current levels necessary for programming and eventually erasing data stored in the memory, beside those that are required during a reading phase.

EEPROM Memories

The requirement of altering the content of the memory by single bytes (herein intended to constitute a unit of information composed by a certain number of bits, for example 8, 16, 32, etc.) without having to reprogram the entire memory as in the case of the so-called EPROM memories, and therefore the requirement of being able to erase certain selected cells while leaving unchanged the information content of other cells, had led to develop so-called EEPROM or $E^2PROM$ cells. (Both "EEPROM" and "$E^2PROM$" are acronyms of Electrically Erasable and Programmable Read Only Memory.) Typically, the problem tied to the necessity of biasing the floating gate (through its capacitive coupling with a control gate) and the semiconducting substrate in order to charge the floating gate and eventually discharge the electrical charge stored therein, has been satisfied by realizing a capacitive coupling zone between the floating gate and a drain region of the semiconducting substrate through a thin tunnelling oxide. Through such a tunnelling window, the flow of electrons from the isolated gate and the drain region of the substrate and vice-versa, during an erasing phase and during a programming phase, is obtained through a Fowler-Nordheim tunnelling mechanism by applying a sufficiently high voltage of one sign or of the opposite sign.

Bytewise erasability of EEPROM memories is achieved with a penalty in terms of compactness of the matrix of memory cells. Overall the cells are from three to four times larger than an EPROM cell, for the same fabrication technology, because they require a select transistor associated with each cell. The fabrication process of an EEPROM memory is notably much more complex of an EPROM process, and the EEPROM memory requires a relatively more complex overhead circuitry as well as the integration of voltage multipliers.

Figure 1:
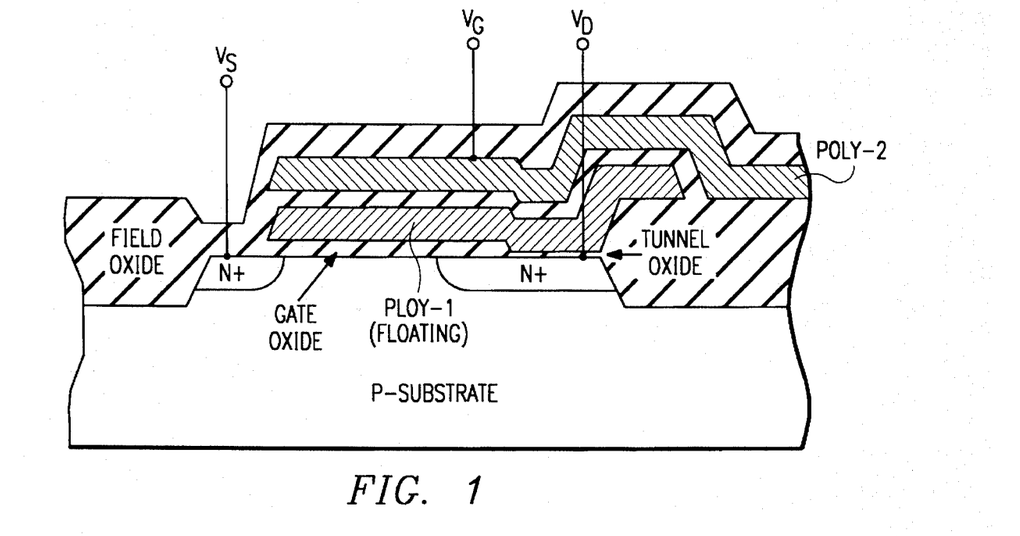
FIGS. 1 and 2 show the cross section of a single cell and the electrical scheme of an EEPROM memory array of a known type, respectively, as already described above.
Figure 2:
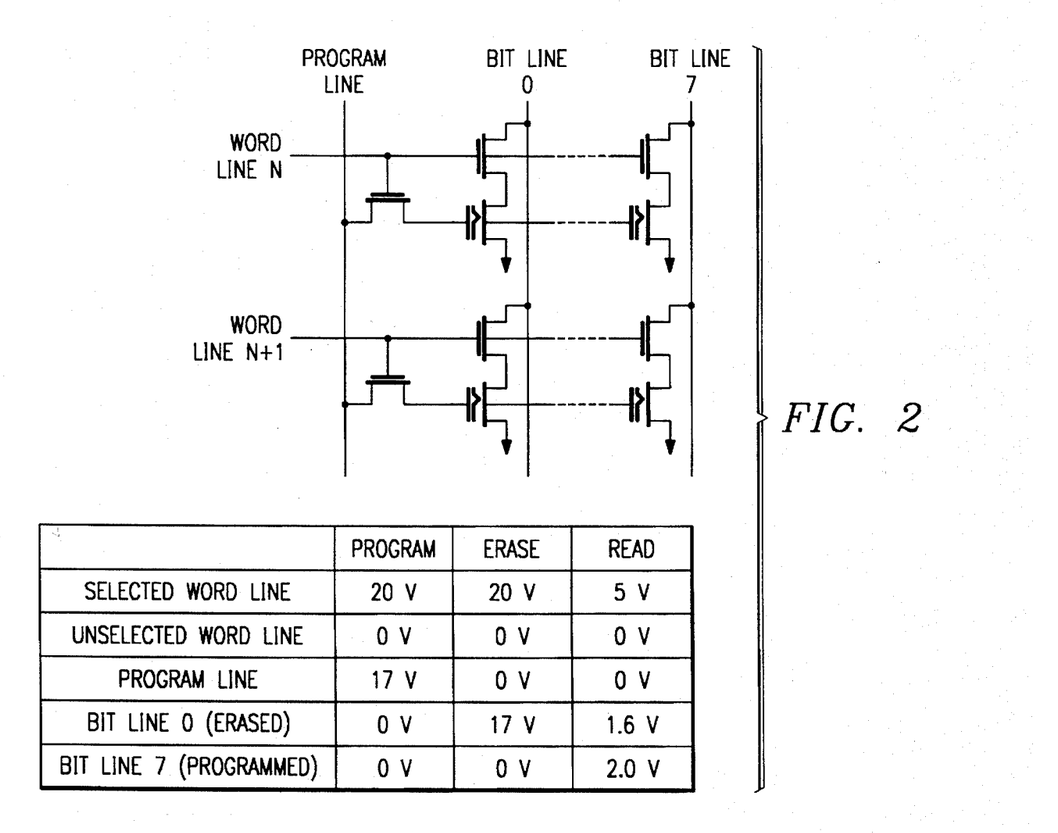

A schematic cross section of an EEPROM cell is shown in FIG. 1, while an electrical scheme of an EEPROM memory array is shown in FIG. 2, which contains also a table showing the typical operation voltages.

FLASH Memories

On the other hand, the improvement of fabrication technologies has allowed a further reduction of the thickness of the isolation dielectric between a floating gate and the monocrystalline silicon substrate while reliably ensuring a substantial absence of defects with an average growth thickness of the oxide of e.g. about 12 nm (120 Å). This has permitted the development of the so-called FLASH memories.

The FLASH memory cell is programmable through a mechanism of injecting hot channel electrons into the floating gate, by biasing the control gate with a sufficiently high positive voltage (for example on the order of 12 V) and the drain with a voltage of about 6 V, in order to produce in the channel zone of the monocrystalline silicon substrate of the cell a strong electric field suitable to generate a current of highly energetic (hot) electrons within the silicon, capable of overcoming the potential barrier at the interface with dielectric and of being thereafter attracted toward the floating gate by the electric field.

Due to the extreme thinness of the normal gate dielectric, erasure can also be accomplished by applying a relatively high voltage (12 V) to the source region and maintaining the other electrodes to ground potential. Under these conditions the electrons that have been injected in the floating gate are able to cross the dielectric according to a Fowler-Nordheim tunnelling mechanism and "discharge" in the source region, during an erasing phase.

The possibility of electrically erasing the memory device without removing it from the printed circuit card for exposing it to UV light, has solved a most severe problem of traditional EPROM memories. With the overcoming of this limitation, all the intrinsic advantages and potentialities of EPROM memories, such as their extreme compactness, speed and above all their relatively low cost, have opened a vast field of application. On the other hand, since the FLASH memory cells have no select transistor, during an erasing phase, some cells rather than others, may reach a depletion state, assuming in practice a negative threshold. If this occurs, during a reading phase of the memory (i.e. with all wordlines grounded with the exception of the wordline to be read), not all the other cells of the addressed bitline would be non-conducting if any of these happened to have been depleted during a preceding erasing (a logic "zero" being the information stored in such cells) and this would cause reading errors.

For this reason, the erasing process of FLASH memories is intrinsically a critical process and is commonly carried out through a succession of pulses of an erasing bias voltage followed by a check until completing the erasing of all the cells of the memory while avoiding to inadvertently bring some of the cells to a depletion state. This erasing process engages in a non-negligible manner the microprocessor that is called to supervise the erasing process of the FLASH memory.

Thus the erasure of FLASH cells is quite different from that of EEPROM cells: because EEPROM cells which are provided with a select transistor, they can be erased to a uniform threshold, identical to the threshold of a virgin cell, under any condition.

Upon completing the erasing of the memory, individual FLASH cells assume a threshold of a value that is not uniform and constant but is normally contained within a certain range of variation. In other words there is a "dispersion" or spread of the threshold values of erased cells, the breath of which is tied also to parameters of the fabrication process. Such a spread of the threshold values of the cells must be taken into account by the circuitry that manages the memory.

For obviating this drawback of FLASH memories, a particular cell structure has been proposed, wherein each control gate line (wordline) of the memory array overlies (is capacitively coupled) only for a portion of its width, the relative floating gates of the cells of the row, while with a portion of its width the wordline constitutes the gate of as many select transistors, each associated to a respective memory cell of the row. In this way, though with a penalty in terms of compactness, a select transistor is associated to each cell, thus making uniform the threshold voltage of all the cells once the erasing of the memory array is performed. This technique is described in the paper entitled "A 128K FLASH-EEPROM using Double Polysilicon Technology" by George Samachisa, Chien-Sheng Su, Yu-Sheng Kao, George Smarandoiu, Ting Wong, Chenming Hu, presented at the IEEE International Solid-State Circuits Conference of Feb. 25, 1987, which is hereby incorporated by reference.

Use of Both FLASH and EEPROM

Notwithstanding the relatively good cost, speed and compactness of FLASH memories, there are some applications which also need, in addition to the FLASH, an EEPROM memory block (typically of much lower capacity) in which to store data that need to be frequently altered (updated).

These requirements generally occur in systems wherein:

only a small portion of the data stored in a permanent (nonvolatile) manner will be frequently updated; and a vast mass of data is destined to remain unvaried in time or to be modified only after relatively long intervals of time or only in consequence of exceptional events. Situations of this type are common in the field of automatic control, regulation, self-diagnostic systems and the like. Such systems are increasingly being employed in the car industry and in similar industries, wherein periodically it is necessary to modify/update certain data relative to tests, maintenance, modification of the values of certain parameters of operation and so forth.

Block-erasable FLASH memories have been proposed to meet these market demands. According to one of these techniques, the possibility of erasing the memory array by blocks is obtained by segmenting the source lines (source diffusions), the use of a further level of metal to define a further order of metal lines to which the portions or segments of source lines are connected through interconnection vias, and the realization of an additional decoder for selecting the blocks of the memory array to be erased. A system of this type is disclosed in U.S. Pat. No. 5,289,423, which is hereby incorporated by reference.

These techniques are intrinsically too inflexible to meet the requirements of different users in an optimum way, and imply a remarkable complication of the layout of the memory array because of the increased number of metal levels and of the need to form a large number of "by-passes" at cross points between orthogonal lines of the same level.

In the majority of cases, the requirements of the users could be satisfied in an optimum way by realizing an EEPROM memory block of sufficient size, in the same chip containing the FLASH memory, typically of much larger capacity, thus avoiding the need of employing two distinct memory devices.

On the other hand, there are obvious difficulties in compatibly integrating in the same device a FLASH memory and an EEPROM memory because of their structural diversity and of the different requisites in terms of voltage levels and current handling capacity of the ancillary circuitry. Problems of compatibility are even more marked in case of "single supply processes," in which different integrated charge pumps and voltage multipliers would be required in order to generate the relatively high voltages that are respectively needed during programming and erasing phases.

Even assuming that the compatibility problems can be overcome by adding steps to the fabrication process (e.g. by recourse to numerous additional masking steps), and by duplicating or multiplying the circuitry needed for generating the different voltages that are necessary during write, read and erase phases of the two different memory arrays, the yield of such a complicated process, and therefore the cost of the devices, would be discouraging with the present technology.

Alternative solutions that offer a pseudo EEPROM performance, though substantially realizing a FLASH memory, by exploiting software methods based on momentarily shifting the data on a different support, their correction and rewriting in the previously erased FLASH memory array, are also burdensome in terms of the time that is required to the system's microprocessor.

Therefore there is a clear need and/or utility of being able to realize on a same chip an EEPROM type memory block in a totally compatible manner with a FLASH memory, through a standard single-supply FLASH fabrication process, without any modification thereof.

Even in the case of stand alone EEPROM type (i.e. erasable by bytes) memory devices, i.e. devices which are not necessarily integrated on the same chip together with a FLASH memory, the possibility of realizing them by a standard FLASH fabrication process, may in many cases represent a great advantage in terms of standardization of fabrication processes and production economy for families of devices or for complementary devices.

This important objective is fully met by the present invention, which offers also other important advantages.

Innovative EEPROM Compatible with FLASH Process and Voltages

The disclosed inventions provide a way to combine FLASH and EEPROM arrays on a single chip, using a normal single-supply FLASH process. The byte erasable (EEPROM) memory array employs an array of FLASH cells organized in rows and columns and individually addressable (during a programming and a reading phase) through a plurality of wordlines and bitlines, according to a normal architecture of nonvolatile memories.

Therefore the mechanism of programming (writing) the cells remains that of a normal FLASH cell, that is injection of hot electrons from the channel region into the floating gate of the cell that takes place in a zone close to the drain diffusion, while in an erasing phase the mechanism used is the Fowler-Nordheim tunnelling mechanism, that takes place in an overlap zone of the floating gate on the source region of the cell.

Byte erasability of the EEPROM memory array is provided by realizing an auxiliary byte selection structure that comprises a byte selection transistor, to a first current terminal of which are connected in common the sources of the cells of a row of the matrix that compose a certain byte, and which has its other current terminal connected to a respective line of a plurality of source biasing lines that are individually selectable by the control circuitry of the memory array. The select transistors of the bytes arranged along the same row of the array have their gate driven in common through a respective line of a number of select lines identical to the number of wordlines of the memory array.

Erasing of a certain byte takes place by biasing, through the byte select transistor connected in series with the sources of the memory cells of the selected byte to be erased, the sources of the cells and the relative wordline (control gate of all the cells of the row containing the byte selected for erasing) with a voltage sufficient to generate a Fowler-Nordheim (FN) tunnelling current of electrons from the floating gate of the cells to their respective source region, while dividing the applied voltage. In practice, to the particular wordline is applied a negative voltage having a value insufficient to cause soft-erasing disturbances on the other unselected memory cells of the same wordline, while a positive, "complementary", voltage is applied to the sources, through the byte select transistor, that is a positive voltage whose value if related to the tunnelling voltage, is reduced by the absolute value of the negative voltage that is applied to the control gate (multiplied by the capacitive ratio of the floating gate cell structure). During an erasing phase, the drains of the cells may be kept at ground potential or be left floating.

According to the parameters of a typical fabrication process of a FLASH memory device, the voltage applied to a wordline during an erasing phase may be of about −5 V while the voltage applied to the sources of the cells of the byte to be erased may be comprised between about 8 V and 9 V. In this way, a voltage difference of about 12 V–13 V is realized while reducing the electrical stress on the other cells of the wordline down to a level that has been found tolerable for the entire period necessary to sequentially erase-all the bytes of a wordline. A voltage of about 3 V may concurrently by applied to all the other (unselected) wordlines.

Conversely, programming of the cells may take place by applying the same voltages as in a normal FLASH memory. Normally, a positive voltage of about 12 V is applied to the wordline (control gate) while to the drain of the cells to be programmed a positive voltage comprised between 5 V and 6 V may be applied through the relative bitlines of the memory matrix. The common source of the cells of the byte selected for programming is grounded through the byte select transistor, while the sources of all the other cells of the same wordline may advantageously be biased, through their respective byte select transistors, at a positive voltage of an intermediate value, for example of about 3 V, to help inhibit soft programming disturbances on unselected cells of the same wordline.

Advantageously the same charge pump or voltage multiplier circuits are used for the FLASH and EEPROM arrays. The only additional requirement is the integration of a charge pump for generating a negative voltage comprised between about −5 V and −8 V, in order to "split" the voltage difference that must be imposed between the control gate and the source of the cells selected for erasing, according to the above described manner. However, this additional negative voltage pump has substantially negligible power requisites, since it is used merely to bias a control gate (wordline).

Of course, the charge pump used for generating the positive voltage for biasing the control gates (wordlines) during programming, which may be of about 12 V, is also an essentially low absorption charge pump, while the charge pump for generating the positive voltage of about 5 V–6 V to be applied to the bitlines of the selected cells for programming, in case of a single supply device designed for operation with relatively low supply voltage (for example about 3 V in the case of battery operable systems) must be designed so as to satisfy the required power requirements. In fact, in this case, the biasing of the drain of a selected cell for programming to a level sufficient to accelerate the channel charge carriers up to sufficiently high kinetic levels (i.e. production of channel hot electrons), produces a non-negligible current through the cell's channel. In case of single supply (for example a 5±10% V or a 3.3±10% V device), such a power requisite may be satisfied directly from the supply.

During a programming phase of the cells, considerations tied to the voltage drops along the current path may limit the programming to few bits at the time, for example to only two bits at the time. In fact, the resistance of the programming current path, for example to the "farthest" cell of an octet of cells constituting a selected byte for programming, may have reached one to several hundreds ohms and the voltage drop, in consideration of the relatively high current (in the vicinity of about 100–500 µA per cell), could become excessive if all the cells of the byte are written in parallel.

Nevertheless the EEPROM memory block may offer an "ERASE-ALL" function, in a completely compatible way.

The increased power needed for implementing an erase-all function of the EEPROM memory block may be provided by exploiting either the supply or the high power charge pump circuit destined to generate the voltage of about 5 V–6 V necessary for biasing the drain during the writing of the cells for biasing through the respective byte select transistors the sources and incrementing the absolute value of the negative voltage for biasing the wordlines from the value of about −5 V used for byte erasing to a value of about −8 V, thus ensuring also during an ERASE-ALL phase a voltage difference of about 12 V between the source and the control gate of the memory cells.

The use of a byte select transistor functionally connected in series with the source of the memory cells (instead of being connected in series with their drain) produces also the important result of ensuring a perfect uniformity of the threshold of the erased cells by preventing them from assuming a negative threshold because of the reaching by any of them of a depleted state during an erasing phase.

This greatly simplifies the erasing process by reducing the burden of supervision of the microprocessor and makes the management of the memory block substantially similar to that of a matrix of EEPROM cells.

Another important aspect of the architecture of the EEPROM block of the invention resides on the fact that each select line to which the gates of all the byte select transistors of the bytes arranged along the same row of FLASH memory cells are connected, is always selected together with the respective wordline of the row of memory cells, during any phase of operation of the memory block. This eliminates the need of implementing an additional logic decoder for selecting the select lines (i.e. the byte select transistors) by being able to employ for this purpose the same logic decoder of the wordlines. Of course, to the wordline and to the respective select line that may be logically selected by a single decoder, different voltages will be applied during the various phases of operation of the memory.

Thus the disclosed inventions permit combination of a byte erasable memory block, with the same functionality of a conventional EEPROM memory, in a fully compatible manner with a normal fabrication process of a FLASH memory device with single supply, without requiring any additional process steps.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF PREFERRED EMBODIMENTS

Figure 3:
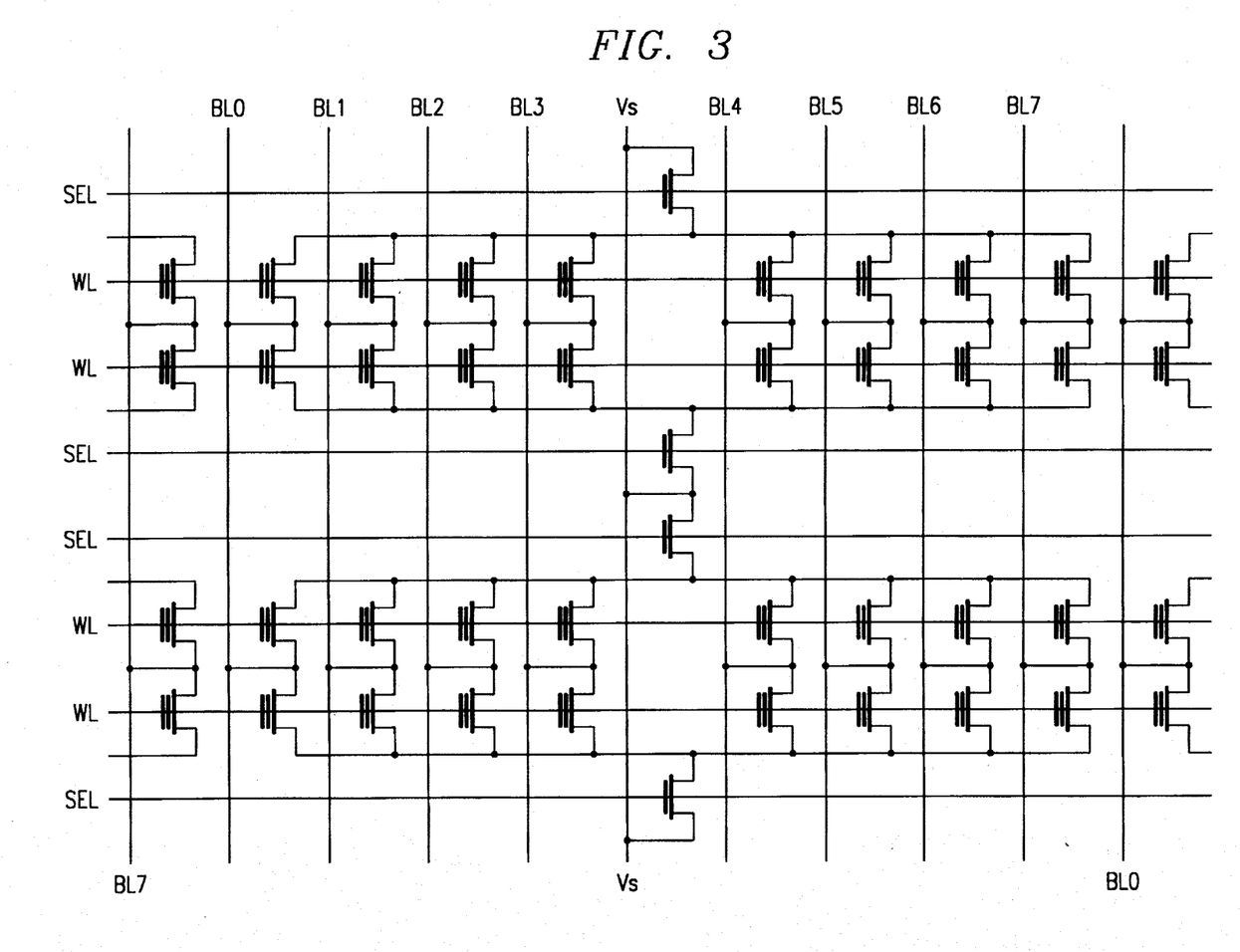
FIG. 3 is a circuit diagram of an EEPROM memory block, organized in bytes each of 8 bits, according to the present invention.

The numerous innovative teachings of the present application will be described with particular reference to the presently preferred embodiment (by way of example, and not of limitation), in which:

The architecture of an EEPROM memory block of the invention, employing a matrix of FLASH cells, is depicted in FIG. 3. The portion of the array of FIG. 3 shows four bytes, each of a 8 bits, for a matrix that may have relatively large dimensions. Four wordlines (WL) and eight bitlines (BL0 . . . BL7) of the four bytes shown are identified in the circuit diagram. The entire array would be an expansion in the two "orthogonal" directions of wordlines and of bitlines, respectively, of the portion depicted in FIG. 3. It is also understood that the particular unit of information (byte) that is individually erasable (and programmable), may also be composed by a lesser or a larger number of bits and be referred to as for instance a "word" etc. In the present context, the expression "byte" is not to be taken as identifying a unit of information necessarily of eight bits. On the contrary, it may also be composed of a number of bits equal or smaller than eight.

The single FLASH memory cells are identified by the relative graphical symbol of a transistor having a double gate. The drains of the cells arranged along each column of the matrix are connected by pairs of adjacent cells to a respective bitline, through drain contacts.

The wordlines WL constitute the control gates of cells arranged along the same row of the matrix.

The sources of all the eight cells of a row that form a byte are connected in common and to a first current terminal of a byte select transistor (Tb1, Tb2, Tb3 and Tb4).

Contrary to a common FLASH memory architecture wherein the source node, typically common to all the cells of the matrix, may be constituted by a single source diffusion having no solution of continuity along the parallel lines relative to the rows of cells of the matrix; in the case of the EEPROM block of the invention, the source diffusions are in the forms of segments, each "segment" pertaining to the cells belonging to a certain byte, along a certain wordline (row) of the matrix.

Preferably though not necessarily, in a geometric middle position of the row-wise length of a particular source diffusion pertaining to a relative byte, a byte select transistor is formed, through which the source common to the (eight) cells of the byte may be biased at a certain voltage, during the different phases of operation of the memory. A first current terminal of each byte select transistor (Tb1 . . . Tb4) is connected to the source diffusion of the cells of the respective byte while the other current terminal is connected, through a contact, to a source biasing line Vs. To the same source biasing line Vs may be connected the relative current terminals of all the byte select transistors (Tb1, Tb2, Tb3, Tb4 . . . ) pertaining to all the bytes that are arranged along a column-wise direction of the memory array.

Of course, the source biasing lines Vs are individually selectable by a suitable decoder, made according to common techniques.

As shown, the connection of the byte select transistors to a respective source biasing line Vs may be realized through a single source contact (C2) for every two adjacent bytes along a column-wise direction.

The resistance of the conductive path through the cell of a selected bit may be reduced and differences among the paths of the various cells that compose a certain byte may be minimized by realizing the byte select transistor at a middle position in relation to the number of cells that form the byte and realizing the byte select transistor with an incremented size (width) as compared with the width of the floating gate cells. Preferably, the byte select transistor has a width that is a multiple of the width of the cells by a factor equivalent to the number of bits of the bytes. In the depicted examples, the byte select transistors Tb1 . . . Tb4, should be made about eight times larger than the memory cells.

As a consequence, during a programming-by-bits phase the sequential selection of the bits to be programmed will be implemented in an optimal way by selecting two bits at a time, one from one side (on the left side according to the diagram of FIG. 3) and the other on the other side (on the right side according to the scheme of FIG. 3) of each source contact (i.e. of the node of connection of the byte select transistor to the respective biasing line Vs). In this way, also during a write (programming) phase, the resistance of the current path through the single cells of the same byte will be minimum.

Figure 4:
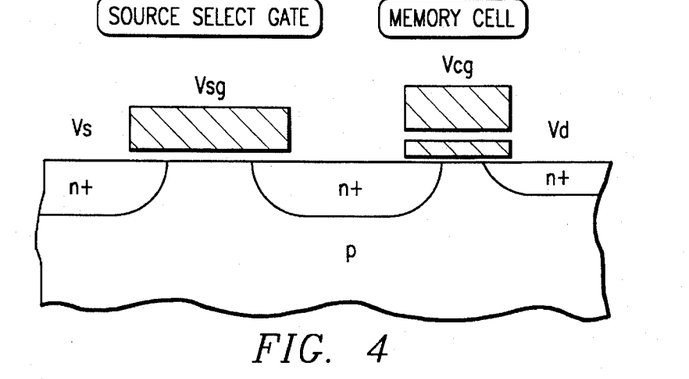
FIG. 4 is a schematic cross section of a single memory cell.

The cross section of each memory cell coupled with a byte select transistors in series with its source is schematically depicted in FIG. 4.

The source biasing voltage Vs is applied through a source contact to a drain (n+) region of the byte select transistor, whose gate Vsg may be constituted by the relative select line SEL, or be connected thereto. The byte select transistor constitutes the select switch for the respective byte, thus allowing to bias the source region (n+) of the FLASH memory cells, the drain region of which may be biased at a drain voltage Vd through a respective contact. The control gate Vcg of the memory cell may be constituted by the relative wordline itself WL or be connected thereto.

Figure 5:
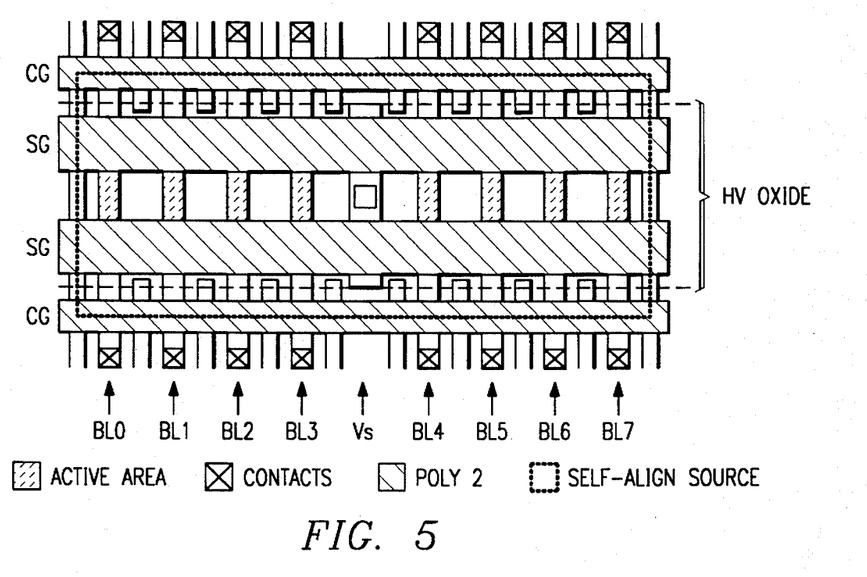
FIG. 5 schematically shows the layout of a memory block of the invention according to an embodiment thereof.

According to a common fabrication process of FLASH memory arrays with self-aligned source diffusion, a schematic layout of the portion of the memory array depicted in FIG. 3 is shown in FIG. 5. The accompanying list of the various symbols used in the illustration facilitates the reading of the layout scheme.

In the following table are indicatively shown for purely illustrative purposes, the biasing voltages used in programming and in erasing the EEPROM memory block of the invention.

| | | EEPROM block: | | | |
|---|---|---|---|---|---|
| operation | node | selected byte | other bytes on selected word line | other bytes on selected bit lines | any other byte |
| program | select gate (Vsg) | 12V | 12V | GND | GND |
| | control gate (Vcg) | 12V | 12V | 3V | 3V |
| | source (Vs) | GND | 3V | OPEN | OPEN |
| | drain (Vd | 5V | OPEN (3V) | 5V | OPEN (3V) |
| erase | select gate (Vsg) | 12V | 12V | GND | GND |
| | control gate (Vcg) | −5V | −5V | GND | GND |
| | source | 8–9V | GND | OPEN | OPEN |

| | | EEPROM block: | | | |
|---|---|---|---|---|---|
| operation | node | selected byte | other bytes on selected word line | other bytes on selected bit lines | any other byte |
| | (Vs) drain (Vd) | OPEN | OPEN | OPEN | OPEN |

For comparison, the following table shows a sample implementation of the biasing voltages used in programming and in erasing the FLASH memory block on the same chip. Note that negative voltages are used on the control gate during the erase operation.

| FLASH block: (biasing conditions for bytes in a single sector of e.g. 64K bytes.) | | | | | |
|---|---|---|---|---|---|
| operation | node | selected byte | other bytes on selected word line | other bytes on selected bit lines | any other byte |
| program | control gate (Vcg) | 12V | 12V | GND | GND |
| | source (Vs) | GND | GND | GND | GND |
| | drain (Vd | 5V | OPEN (0V) | 5V | OPEN (0V) |
| erase | control gate (Vcg) | −8V | −8V | −8V | −8V |
| | source (Vs) | 5V | 5V | 5V | 5V |
| | drain (Vd) | OPEN | OPEN | OPEN | OPEN |

Of course, the voltage levels indicated in the above table refer to a sample embodiment and may be varied in function of the thicknesses of dielectrics used and of the cell's size. During a programming phase, the drain of the cells of the deselected bytes of the same wordline and of the bytes corresponding to deselected bitlines may not be forced to any externally applied voltage. In case of deselected cells of the selected wordline and of the other deselected cells of the matrix, the drain will assume the reduced voltage (3 V) that is applied to the source in view of the fact that the cells are conductive.

The invention meets the main objective of allowing realization in a fully compatible way on the same chip of a memory block having an EEPROM type functionality together with a FLASH memory, without altering in any way the fabrication process and substantially without duplicating many of the control circuits of a FLASH memory in order to satisfy different requisites of an EEPROM memory block. In reaching these important results, the architecture of the invention produces other important advantages as the elimination of problems relative to the threshold dispersion of erased FLASH cells of the EEPROM memory block in connection with the relatively frequent erasing processes that the cells are subject to, beside ensuring an "ERASE-ALL" function, without requiring realization of distinct charge pump circuits for satisfying the different requisites of bias voltages and current absorption.

According to a preliminary estimate based on a layout as the one depicted in FIG. 5, the equivalent cell size for a byte erasable memory block that can be fabricated in a completely compatible manner on the same chip containing a FLASH memory for single supply, overall would be equal to about three times the size for a FLASH memory of identical storage capacity.

Thus in a sample embodiment, a 128 Kbit byte erasable memory block (having an EEPROM type functionality) with a capacity of 128 Kbyte, can be laid out in about 4 mm², using a FLASH process (not an EEPROM process) with a line width of 0.6 μm. The block may be operated at the single supply voltage of the FLASH device (which commonly is of about 5 V±10%), though in future applications the supply voltage is contemplated to be in the vicinity of about 3.3 V (±10%). The typical programming time would be of about 5 μsec/bit, while the typical erasing time would be of about 5 msec/byte. Reliability is estimated to be more than 100K erasing/programming cycles.

Figure 6:
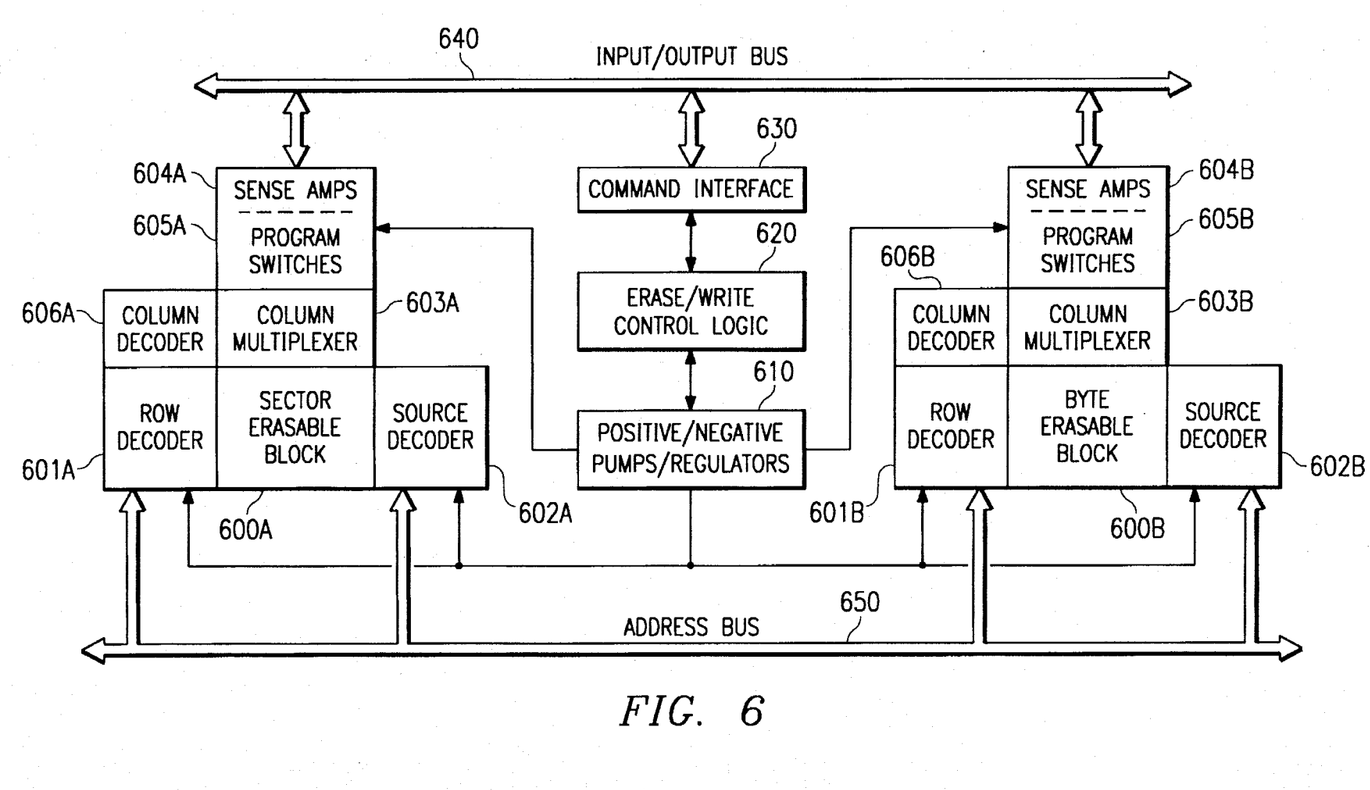
FIG. 6 is a block diagram of a sample integrated circuit, which contains both FLASH and EEPROM memory arrays according to the present invention.

FIG. 6 is a block diagram of a sample integrated circuit, which contains both FLASH and EEPROM memory arrays according to the present invention. Memory array 600A is sector erasable, and array 600B is byte erasable. Each of these arrays has its own row decoders 601A/601B, source decoders 602A/602B, column multiplexers 603A/603B, Sense Amps 604A/604B, programmation switches 605A/605B, and column decoders 606A/606B. These components are generally conventional, except for their connection to implement the erasure voltage relations listed above. Each of the arrays is interfaced to an address bus 650 and to a data bus 640. The data bus 640 is also interfaced to command interface logic 630, which in turn is interfaced to erase/write control logic 620. The erase/write control logic 620 controls voltage supply circuitry 610, which includes positive and negative charge pumps and associated regulators. The pumped voltages generated by voltage supply circuitry 610 are supplied to the programmation switches 605A/605B, to the row decoders 601A/601B, and to the source decoders 602A/602B.

Programmation Issues Due to Byte-Wide Source Select Transistor

The following text describes implementation techniques to avoid program disturbance in the foregoing embodiment. (This problem is related to the use of a byte-wide source select transistor and to the need of an inhibit voltage to reduce drain stress on unselected bytes, in the foregoing embodiment.)

Recall that the basic idea of the byte erasable array is to add a select gate at the source side of standard flash cells; the select gate allows to apply the erase voltage only to the source of the selected byte.

The select gate also allows to bias, during programming, the control gate of unselected bytes to an inhibit voltage in order to reduce the drain stress which can last orders of magnitude longer than in a standard flash memory array.

To minimize the source access resistance in programming and reading, we have proposed a structure in which the source select is common to all the cells of the byte and it is as large as 8 times the cell width.

Figure 7:
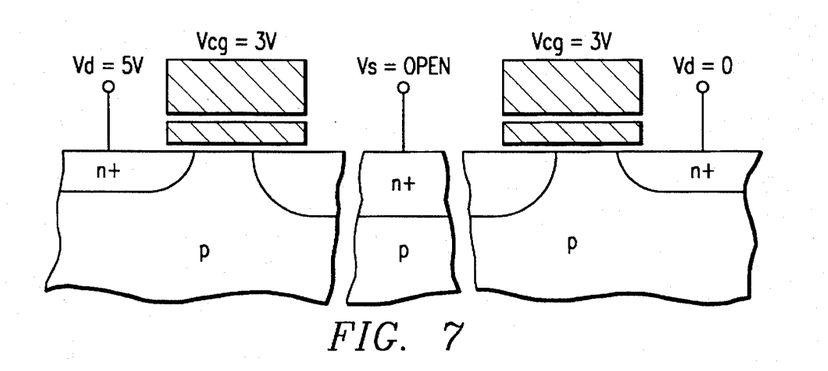
FIG. 7 illustrates a possible problem of program disturb in an unselected byte on selected bit lines, due to cross talk between two erased cells (bit line leakage).

This choice together with the voltage scheme we have proposed would cause an unacceptable bit line leakage in programming. Indeed an unselected byte on selected bit lines would have 3 V on the control gate, the drain of one or two cells at 5–6 V (they are the cells connected to the bit lines actually selected for programming) and the drain of the other cells at ground. In this condition, even if the select gate is off, there can be a current path from selected bit line to the other bit lines of the same byte because of the common source of the cells within the byte. This situation is shown in FIG. 7, where it is assumed that both cells in the drawing are erased (Vt<3 V); the number of paths like this in parallel would depend on the written pattern, but could normally be large enough to cause a very large current absorption.

The most straightforward way to overtake the problem would be to split the select gates in order to have one select transistor per cell. That would completely avoid any cross-talk between bit-lines but it would increase the series resistance; the impact of such a series resistance on programming and reading should be quantitatively evaluated together with the possibility of relaxing the cell size to accommodate a less resistive select transistor.

An alternative solution (which is somewhat more risky) is, in the presently preferred embodiment. This solution retains the density and performance advantages of the proposed array structure.

The idea is to change the programming conditions and, instead of keeping the unselected bit lines of selected byte at ground, to bias them to e.g. 2 V; such a voltage is too low to modify the cell Vt (in view of the programming duration, and the effect of source select gate), but is definitely enough to shut off the leakage path (as may be seen by considering the effect of body-effect in FIG. 8), assuming that the erased cells are not depleted.

Current consumption associated to this operation, in which all the cells of the byte are biased either to 5–6 V or to 2 V, would never exceed the current absorbed to program a byte (all cells biased to 5–6 V, in worst case); and the charge pump must be designed for at least this much capacity in any case.

Erase Algorithm

The following text also provides more detail on the erase algorithm.

The erase algorithm cannot be similar to the flash one in which the voltage is fixed and time is increased until the erase verify test is successfully passed; this algorithm causes an erase time variation from lot to lot which is dependent on history, and which is not compatible with EEPROM specifications.

We could use a fixed pulse, as in EEPROM's, to heavily overerase the cell and to allocate enough margin for process variations and aging. The presence of the select gate would allow this without any problem in reading, but voltage limitations, reliability, and programming efficiency pose serious constraints on this approach, moreover, that approach would make it more difficult to implement the solution noted above to avoiding program disturb.

Figure 8:
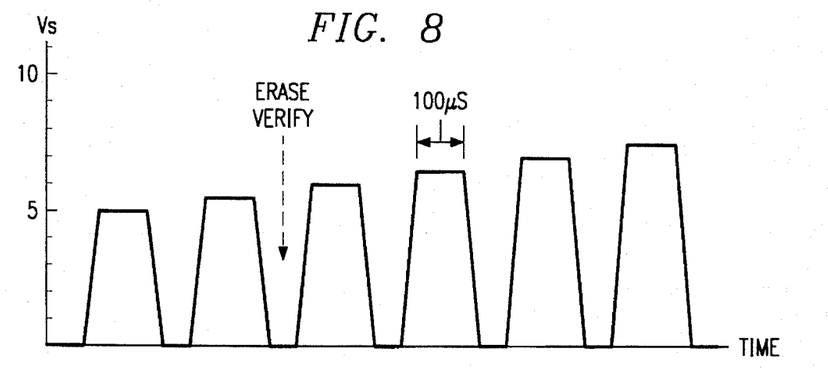
FIG. 8 shows alternative voltage relations in an unselected byte on a selected bit line. Note that a slightly increased drain voltage is used to avoid problems.
Figure 9:
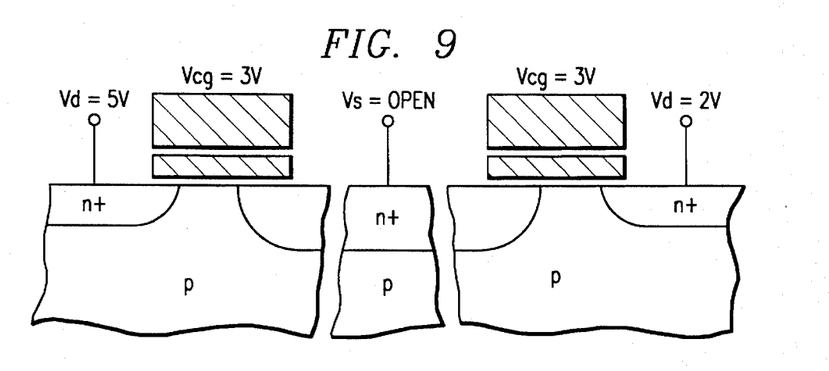
FIG. 9 shows an erase algorithm contemplated as the presently preferred embodiment. In this example, each erase pulse plus verify operation takes a total of 160 μs (in byte/page mode). Steps of 250 mV are used to ramp up from 5 V to 10 V, for a maximum total of 25 pulses and a maximum erase time of no more than 4 ms.

We prefer to propose an erase algorithm more similar to the reprogramming one, with a sequence of linearly ramped pulses (as shown in FIG. 8) together with erase verification after every pulse. This algorithm avoids overerasure, while dramatically reducing erase time spread over process variations and cycling.

The generation of a stabilized voltage reference (bandgap) is anyway necessary in single power supply flash memories, and thus precision voltage control can easily be implemented.

Figure 10:
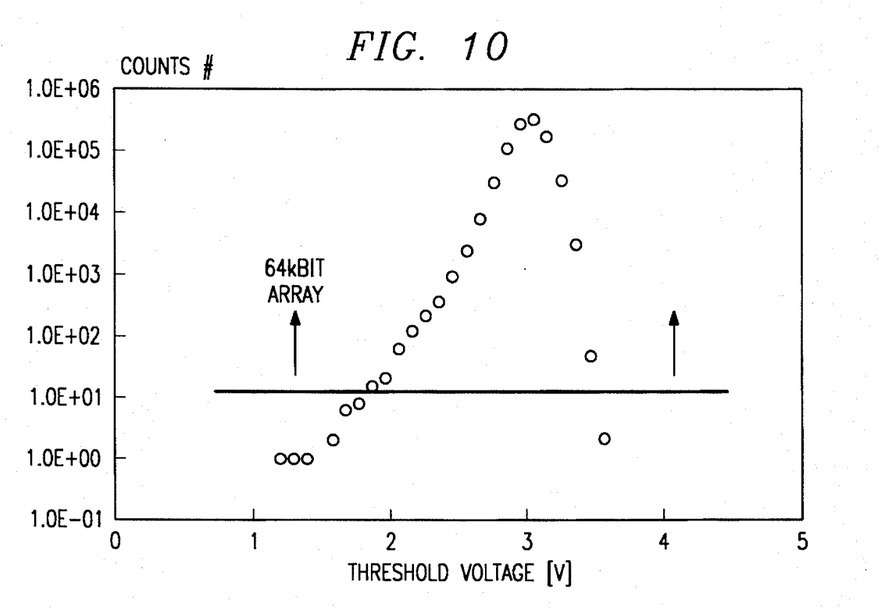
FIG. 10 shows an example of Vt distribution after electrical erase of a 1M Flash memory. Note that this example shows a wide dispersion of Vt values; an advantage of the disclosed innovations is that such a wide dispersion of Vt values can be tolerated. The horizontal line shows the narrower dispersion which may be achieved within a single 64K block.

The presently preferred embodiment uses an overall scheme of voltages which may appear somewhat complex, but provides enough margin to allow for process variation. A further advantage is that, due to the low complexity, the block can be designed for a 2 V Vt distribution (FIG. 10).

According to a disclosed class of innovative embodiments, there is provided: An integrated circuit, connected to be powered by a single supply voltage and ground, comprising: a first array of floating-gate memory cells which includes integrated select transistors to permit selective erasure of individual bytes of data; a second array of floating-gate memory cells which does not include the integrated select transistors; wherein all the cells in the first and second arrays include a floating gate capacitively coupled to a channel through a thin gate oxide, but do not include any tunnel oxide which is thinner than the thin gate oxide; an on-chip charge-pumping circuit which generates a first pumped voltage which is more extreme than and has the same polarity as the supply voltage, and a second pumped voltage which has a polarity opposite to the supply voltage; the charge-pumping circuit providing the first and second pumped voltages not only to the first array, but also to the second array; auxiliary circuitry which provides read, write, and erase access to the first and second arrays; the erase access being bytewise selectable in the first array, but not in the second array.

According to a disclosed class of innovative embodiments, there is provided: An integrated circuit, connected to be powered by a single supply voltage and ground, comprising: a first block-erasable array of floating-gate memory cells which includes integrated select transistors to also permit selective erasure of individual bytes of data; a second block-erasable array of floating-gate memory cells which does not include the integrated select transistors; wherein all the cells in the first and second arrays include a floating gate capacitively coupled to a channel through a thin gate oxide, but do not include any tunnel oxide which is thinner than the thin gate oxide; an on-chip charge-pumping circuit which provides both positive and negative pumped voltages to both the first and second arrays; and auxiliary circuitry which provides read, write, and erase access to the first and second arrays; the erase access being bytewise selectable in the first array, but not in the second array.

According to a disclosed class of innovative embodiments, there is provided: An integrated circuit, connected to be powered by a single supply voltage and ground, comprising: a first array of floating-gate memory cells which includes integrated select transistors to permit selective erasure of individual bytes of data; a second array of floating-gate memory cells which does not include the integrated select transistors; wherein all the cells in the first and second arrays include a floating gate capacitively coupled to a channel through a thin gate oxide, but do not include any tunnel oxide which is thinner than the thin gate oxide; an on-chip charge-pumping circuit which provides both positive and negative pumped voltages; and auxiliary circuitry which provides read, write, and erase access to the first and second arrays; the erase access being bytewise selectable in the first array, but not in the second array; the auxiliary circuitry including address decoders to identify selected ones of the cells; wherein when write access is selected, selected ones of the cells receive a positive pumped voltage from the charge-pumping circuit on respective control gates thereof; and wherein when erase access is selected, selected ones of the cells receive a negative pumped voltage from the charge-pumping circuit on respective control gates thereof.

According to a disclosed class of innovative embodiments, there is provided: A FLASH-compatible integrated circuit bytewise-erasable EEPROM, comprising: first and second arrays of FLASH memory cells organized in n bytes, each composed of m bits and individually selectable through a plurality of wordlines and of bitlines; and an auxiliary selection structure, integrated with the first array but not with the second array, and composed of n byte select transistors; a plurality of individually selectable source biasing lines; a plurality of select lines in a number identical to the number of the wordlines; each byte select transistor having a first current terminal connected to a respective source biasing line, a second current terminal connected to the sources connected in common of the memory cells that compose a respective byte, and a gate connected to a respective, individually selectable select line; whereby the first array provides EEPROM functionality, and the second array provides FLASH functionality.

According to a disclosed class of innovative embodiments, there is provided: A method for operating, from a single supply voltage, an EEPROM array which uses field-effect transistor memory cells without any tunnel oxide, each cell having a source, a drain, a floating gate, and a control gate, the array also including respective select transistors each having a respective select gate and each having a current-carrying terminal connected to the sources of one or more the cells, comprising the steps of: (1.) providing a first pumped voltage which is more extreme than and has the same polarity as the supply voltage, and a second pumped voltage which has a polarity opposite to the supply voltage; (A.) when programmation is desired, applying the first pumped voltage to the control gate of a selected cell while turning on the transistor of the selected cell; and ((a)) when erasure is desired, applying the second pumped voltage to the control gate of a selected cell while turning on a respective associated one of the select transistors and therethrough pulling the source to a voltage which is not ground and is of opposite polarity to the second pumped voltage, and floating the drain.

According to a disclosed class of innovative embodiments, there is provided: A method for operating an EEPROM array, which uses field-effect transistor memory cells without any tunnel oxide, each cell having a source, a drain, a floating gate and a control gate, and respective select transistors each having a respective select gate and each having a current-carrying terminal connected to the sources of one or more the cells, comprising the steps of: (i)) providing a first voltage which is more extreme than and has the same polarity as the supply voltage, and a second voltage which has a polarity opposite to the supply voltage; (1.) when programmation is desired, applying the first voltage to the control gate of a selected cell while turning on the transistor of the selected cell; and ((a)) when erasure is desired, applying the second voltage to the control gate of a selected cell while turning on a respective associated one of the select transistors and therethrough pulling the source to a voltage which is not ground and is of opposite polarity to the second voltage, and floating the drain.

According to a disclosed class of innovative embodiments, there is provided: A method for operating an EEPROM array, which uses field-effect transistor memory cells without any tunnel oxide, each cell having a source, a drain, a floating gate and a control gate, and respective select transistors each having a respective select gate and each having a current-carrying terminal connected to the sources of one or more the cells, comprising the steps of: (i)) when programmation of a cell is desired, applying: to the select gate corresponding to the selected cell: a first voltage which is more extreme than and has the same polarity as a supply voltage; to the control gate of the selected cell: the first voltage; to the control gates of unselected cells: the supply voltage; to the source of the selected cell: ground; to the sources at least some unselected cells: the supply voltage; to the drain of the selected cell: a fourth voltage which has the same polarity as and is less extreme than the first and third voltages; (ii)) when erasure of a cell is desired, applying to the select gate corresponding to the selected cell: the first voltage; to the control gate of the selected cell: a second voltage which has a polarity opposite to the supply voltage; and to the source of the selected cell: a third voltage which has the same polarity as and is less extreme than the first voltage.

According to a disclosed class of innovative embodiments, there is provided: A method for permitting bytewise erasing of a first array of FLASH cells organized in n bytes, each of m bits, individually selectable through a plurality of wordlines and bitlines, the first array being integrated with a second array of FLASH cells, comprising the steps of: providing an auxiliary selection structure, for the FLASH cells in the first array but not for the FLASH cells in the second array, comprising n byte select transistors, each transistor having a first current terminal connected in common to the sources of all the m cells that compose a respective byte and having a second current terminal connected to a respective source biasing line of a plurality of individually selectable source biasing lines and a plurality of select lines, each select line being connected to the gates of the select transistors pertaining to the bytes disposed along the same wordline of the array; and subdividing the voltage applied between a control gate and the respective common source region of the m cells of the first array that compose a certain selected byte about a common ground potential that is applied to the source regions of all the other memory cells of the same selected wordline, during an erasing phase; wherein the sub-dividing step also defines the potentials applied to the second array.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

For another example, the described structure refers to "bytes," but the number of bits in each "byte" need not be 8, but can instead be e.g. 4, 16, 24, or 32. Specifically, the described structure provides bytewise access in the EEPROM-like array, but alternatively the disclosed chip can be adapted for bit-by-bit access if desired, i.e. with a "byte" size of 1 bit. (However, this is distinctly less preferable.)

For another example, the FLASH array has been referred to as sector-erasable, but of course the sector-erasable feature can alternatively be omitted from this array if desired. In such embodiments the FLASH array would have to be erased as a whole.

For another example, multiple bytewise-erasable (EEPROM) arrays, and/or multiple sector-erasable (FLASH) arrays, can be used if desired.

Of course, the compatibility with a standard FLASH process is an advantage, not a limitation, of the disclosed innovations. Thus other process steps can readily be added if desired for other reasons (e.g. to incorporate power or high-voltage devices in a smart-power ASIC).

For another example, the chip need not be limited to the architecture shown in FIG. 6: the innovative ideas can also be applied very advantageously to various other chip architectures, e.g. integrated with a microcontroller, or with a DSP, or with various ASIC or custom architectures.

What is claimed is:

1. An integrated circuit, connected to be powered by a single supply voltage and ground, comprising:

a first array of floating-gate memory cells which includes integrated select transistors to permit selective erasure of individual bytes of data;

a second array of floating-gate memory cells which does not include said integrated select transistors; wherein all said cells in said first and second arrays include a floating gate capacitively coupled to a channel through a thin gate oxide, but do not include any tunnel oxide which is thinner than said thin gate oxide;

an on-chip charge-pumping circuit which generates
a first pumped voltage which is more extreme than and has the same polarity as said supply voltage, and
a second pumped voltage which has a polarity opposite to said supply voltage;

said charge-pumping circuit providing said first and second pumped voltages not only to said first array, but also to said second array;

auxiliary circuitry which provides read, write, and erase access to said first and second arrays; said erase access being bytewise selectable in said first array, but not in said second array.

2. The integrated circuit of claim 1, wherein said auxiliary circuitry comprises, for each said array, a row decoder, a column decoder, a sense amplifier, and switches for selectably applying said pumped voltages to ones of said cells.

3. The integrated circuit of claim 1, wherein said second array is more than 4 times as large as said first array.

4. An integrated circuit, connected to be powered by a single supply voltage and ground, comprising:

a first block-erasable array of floating-gate memory cells which includes integrated select transistors to also permit selective erasure of individual bytes of data;

a second block-erasable array of floating-gate memory cells which does not include said integrated select transistors; wherein all said cells in said first and second arrays include a floating gate capacitively coupled to a channel through a thin gate oxide, but do not include any tunnel oxide which is thinner than said thin gate oxide;

an on-chip charge-pumping circuit which provides both positive and negative pumped voltages to both said first and second arrays; and auxiliary circuitry which provides read, write, and erase access to said first and second arrays; said erase access being bytewise selectable in said first array, but not in said second array.

5. The integrated circuit of claim 4, wherein said auxiliary circuitry comprises, for each said array, a row decoder, a column decoder, a sense amplifier, and switches for selectably applying said pumped voltages to ones of said cells.

6. The integrated circuit of claim 4, wherein said second array is more than 4 times as large as said first array.

7. An integrated circuit, connected to be powered by a single supply voltage and ground, comprising:

a first array of floating-gate memory cells which includes integrated select transistors to permit selective erasure of individual bytes of data;

a second array of floating-gate memory cells which does not include said integrated select transistors; wherein all said cells in said first and second arrays include a floating gate capacitively coupled to a channel through a thin gate oxide, but do not include any tunnel oxide which is thinner than said thin gate oxide;

an on-chip charge-pumping circuit which provides both positive and negative pumped voltages; and auxiliary circuitry which provides read, write, and erase access to said first and second arrays;

said erase access being bytewise selectable in said first array, but not in said second array;

said auxiliary circuitry including address decoders to identify selected ones of said cells;

wherein when write access is selected, selected ones of said cells receive a positive pumped voltage from said charge-pumping circuit on respective control gates thereof; and wherein when erase access is selected, selected ones of said cells receive a negative pumped voltage from said charge-pumping circuit on respective control gates thereof.

8. The integrated circuit of claim 7, wherein said auxiliary circuitry comprises, for each said array, a row decoder, a column decoder, a sense amplifier, and switches for selectably applying said pumped voltages to ones of said cells.

9. The integrated circuit of claim 7, wherein said second array is more than 4 times as large as said first array.

10. A FLASH-compatible integrated circuit bytewise-erasable EEPROM, comprising:

first and second arrays of FLASH memory cells organized in n bytes, each composed of m bits and individually selectable through a plurality of wordlines and of bitlines; and an auxiliary selection structure, integrated with said first array but not with said second array, and composed of n byte select transistors;

a plurality of individually selectable source biasing lines;

a plurality of select lines in a number identical to the number of said wordlines;

each byte select transistor having a first current terminal connected to a respective source biasing line, a second current terminal connected to the sources connected in common of the memory cells that compose a respective byte, and a gate connected to a respective, individually selectable select line;

whereby said first array provides EEPROM functionality, and said second array provides FLASH functionality.

11. An EEPROM as defined in claim 10, wherein each wordline and relative select line of said matrix of memory cells are selected in a biunivocal way by means of a single logic decoder.

12. An EEPROM as defined in claim 10, comprising means for selectively biasing, during a programming phase, a wordline and a relative select line of said matrix at a first positive voltage and the other wordlines and select lines at a second positive voltage which is a fraction of said first voltage and to ground potential, respectively, and through said byte select transistors, the sources of the memory cells of a certain selected byte at said ground potential and the sources of the other cells of said wordline at said second positive voltage or a similarly intermediate voltage.

13. An EEPROM as defined in claim 12, wherein during a bytewise erasing phase of operation, said means biases a selected wordline to a negative voltage of an absolute value lower than the absolute value of said first positive voltage and the other wordlines at ground potential, said respective select line at said first positive voltage and the other select lines at ground potential, and, through said byte select transistors, the sources of the cells of the selected byte at a second positive voltage of an intermediate value between said first and second positive voltages, and the sources of the other unselected cells of said wordline to ground potential.

14. An EEPROM as defined in claim 13, wherein during an erase-all phase of operation of the memory, said means bias the source of all cells said the drain biasing voltage used during a programming phase, said voltage being provided by a respective voltage multiplier capable of delivering a certain current through all the cells of the bitlines that are selected during a programming phase and the wordlines of the memory at a negative voltage of an absolute value sufficient to provide for a given potential difference between the source and a control gate of each single cell.

15. An EEPROM as defined in claim 10, wherein said byte select transistors have a width that is at least m times greater than the width of said FLASH cells.

16. An EEPROM as defined in claim 15, wherein each of said byte select transistors is formed midway along the length of a common source diffusion of the memory cells that compose the respective byte.

17. An EEPROM as defined in claim 16, wherein a single contact connects a current terminal of two byte select transistors of two column-wise adjacent bytes of said matrix to a respective source biasing line.

18. A method for operating, from a single supply voltage, an EEPROM array which uses field-effect transistor memory cells without any tunnel oxide, each cell having a source, a drain, a floating gate, and a control gate, said array also including respective select transistors each having a respective select gate and each having a current-carrying terminal connected to the sources of one or more said cells, comprising the steps of:

(a.) providing a first pumped voltage which is more extreme than and has the same polarity as said supply voltage, and a second pumped voltage which has a polarity opposite to said supply voltage;

(b.) when programmation is desired, applying said first pumped voltage to the control gate of a selected cell while turning on the transistor of said selected cell; and (c.) when erasure is desired, applying said second pumped voltage to the control gate of a selected cell while turning on a respective associated one of said select transistors and therethrough pulling said source to a voltage which is not ground and is of opposite polarity to said second pumped voltage, and floating said drain.

19. The method of claim 18, wherein a FLASH memory array is integrated on the same chip with said EEPROM array, and said FLASH memory cells are technologically identical with said cells of said EEPROM array, but do not include said select transistors.

20. The method of claim 18, wherein a FLASH memory array is integrated on the same chip with said EEPROM array, and said FLASH memory cells are technologically identical with said cells of said EEPROM array, but do not include said select transistors; and wherein when programmation of a cell in said FLASH array is desired, said first voltage is applied to the control gate of a selected cell; and wherein when erasure of a block of cells in said FLASH array is desired, said second voltage is applied to the control gates of cells in said block.

21. A method for operating an EEPROM array, which uses field-effect transistor memory cells without any tunnel oxide, each cell having a source, a drain, a floating gate and a control gate, and respective select transistors each having a respective select gate and each having a current-carrying terminal connected to the sources of one or more said cells, comprising the steps of:

(a.) providing a first voltage which is more extreme than and has the same polarity as said supply voltage, and a second voltage which has a polarity opposite to said supply voltage;

(b.) when programmation is desired, applying said first voltage to the control gate of a selected cell while turning on the transistor of said selected cell; and (c.) when erasure is desired, applying said second voltage to the control gate of a selected cell while turning on a respective associated one of said select transistors and therethrough pulling said source to a voltage which is not ground and is of opposite polarity to said second voltage, and floating said drain.

22. The method of claim 21, wherein a FLASH memory array is integrated on the same chip with said EEPROM array, and said FLASH memory cells are technologically identical with said cells of said EEPROM array, but do not include said select transistors.

23. The method of claim 21, wherein a FLASH memory array is integrated on the same chip with said EEPROM array, and said FLASH memory cells are technologically identical with said cells of said EEPROM array, but do not include said select transistors; and wherein when programmation of a cell in said FLASH array is desired, said first voltage is applied to the control gate of a selected cell; and wherein when erasure of a block of cells in said FLASH array is desired, said second voltage is applied to the control gates of cells in said block.

24. A method for operating an EEPROM array, which uses field-effect transistor memory cells without any tunnel oxide, each cell having a source, a drain, a floating gate and a control gate, and respective select transistors each having a respective select gate and each having a current-carrying terminal connected to the sources of one or more said cells, comprising the steps of:

(a.) when programmation of a cell is desired, applying:
  to the select gate corresponding to the selected cell: a first voltage which is more extreme than and has the same polarity as a supply voltage;
  to the control gate of the selected cell: said first voltage;
  to the control gates of unselected cells: the supply voltage;
  to the source of the selected cell: ground;
  to the sources at least some unselected cells: the supply voltage;
  to the drain of the selected cell: a fourth voltage which has the same polarity as and is less extreme than said first and third voltages;

(b.) when erasure of a cell is desired, applying
  to the select gate corresponding to the selected cell: said first voltage;
  to the control gate of the selected cell: a second voltage which has a polarity opposite to said supply voltage; and
  to the source of the selected cell: a third voltage which has the same polarity as and is less extreme than said first voltage.

25. The method of claim 24, wherein a FLASH memory array is integrated on the same chip with said EEPROM array, and said FLASH memory cells are technologically identical with said cells of said EEPROM array, but do not include said select transistors.

26. The method of claim 24, wherein a FLASH memory array is integrated on the same chip with said EEPROM array, and said FLASH memory cells are technologically identical with said cells of said EEPROM array, but do not include said select transistors; and wherein when programmation of a cell in said FLASH array is desired, said first voltage is applied to the control gate of a selected cell; and wherein when erasure of a block of cells in said FLASH array is desired, said second voltage is applied to the control gates of cells in said block.

27. A method for permitting bytewise erasing of a first array of FLASH cells organized in n bytes, each of m bits, individually selectable through a plurality of wordlines and bitlines, said first array being integrated with a second array of FLASH cells, comprising the steps of:

providing an auxiliary selection structure, for said FLASH cells in said first array but not for said FLASH cells in said second array, comprising n byte select transistors, each transistor having a first current terminal connected in common to the sources of all the m cells that compose a respective byte and having a second current terminal connected to a respective source biasing line of a plurality of individually selectable source biasing lines and a plurality of select lines, each select line being connected to the gates of the select transistors pertaining to the bytes disposed along the same wordline of said array; and subdividing the voltage applied between a control gate and the respective common source region of said m cells of said first array that compose a certain selected byte about a common ground potential that is applied to the source regions of all the other memory cells of the same selected wordline, during an erasing phase;

wherein said subdividing step also defines the potentials applied to said second array.

* * * * *